United States Patent
Shih et al.

(10) Patent No.: US 8,470,708 B2
(45) Date of Patent: Jun. 25, 2013

(54) DOUBLE PATTERNING STRATEGY FOR CONTACT HOLE AND TRENCH IN PHOTOLITHOGRAPHY

(75) Inventors: Po-Cheng Shih, Hsinchu (TW); Kuan-Chen Wang, Hsinchu (TW); Chung-Chi Ko, Nantou (TW); Keng-Chu Lin, Chao-Chou Ping-Tung (TW); Tai-Yen Peng, Hsinchu (TW); Wen-Kuo Hsieh, Changhua County (TW); Chih-Hao Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 36 days.

(21) Appl. No.: 12/712,515

(22) Filed: Feb. 25, 2010

(65) Prior Publication Data

US 2011/0207329 A1 Aug. 25, 2011

(51) Int. Cl.
*H01L 21/44* (2006.01)
(52) U.S. Cl.
USPC ............................................... 438/636
(58) Field of Classification Search
USPC .......................................... 438/154, 637, 636
See application file for complete search history.

(56) References Cited

U.S. PATENT DOCUMENTS

| | | | |
|---|---|---|---|
| 5,858,870 A * | 1/1999 | Zheng et al. | 438/622 |
| 6,696,222 B2 | 2/2004 | Hsue et al. | |
| 6,852,640 B2 * | 2/2005 | Gutsche | 438/719 |
| 7,001,833 B2 | 2/2006 | Bao et al. | |
| 7,540,970 B2 | 6/2009 | Koh et al. | |
| 7,871,908 B2 | 1/2011 | Yatsuda et al. | |
| 7,947,432 B2 * | 5/2011 | Endo et al. | 430/313 |
| 2003/0059720 A1 * | 3/2003 | Hwang et al. | 430/311 |
| 2004/0175932 A1 * | 9/2004 | Kim et al. | 438/637 |
| 2006/0189051 A1 * | 8/2006 | Kim | 438/154 |
| 2007/0125750 A1 * | 6/2007 | Weng et al. | 216/67 |
| 2007/0197014 A1 | 8/2007 | Jeon et al. | |
| 2007/0231750 A1 | 10/2007 | Parikh | |
| 2008/0081461 A1 | 4/2008 | Lee et al. | |
| 2009/0081864 A1 | 3/2009 | Matz et al. | |
| 2010/0193919 A1 * | 8/2010 | Warrick et al. | 257/635 |

OTHER PUBLICATIONS

Maenhoudt et al. ("Double Patterning scheme for sub-0.25 ki single damascene structures at NA-0.75, λ=193nm", Optical Microlithography XVIII, Proceedings of SPIE vol. 5754, 2005).*
Dusa et al. ("Prospects and Initial Exploratory Results for Double Exposure/Double Pitch Technique", IEEE 2005).*

* cited by examiner

*Primary Examiner* — Charles Garber
*Assistant Examiner* — André C Stevenson
(74) *Attorney, Agent, or Firm* — Slater & Matsil, L.L.P.

(57) ABSTRACT

A method of lithography patterning includes forming a mask layer on a material layer and forming a capping layer on the mask layer. The capping layer is a boron-containing layer with a higher resistance to an etching reaction of patterning process of the material layer. By adapting the boron-containing layer as the capping layer, the thickness of the mask layer can be thus reduced. Hence, a better gap filling for forming an interconnect metallization in the material layer could be achieved as well.

20 Claims, 6 Drawing Sheets

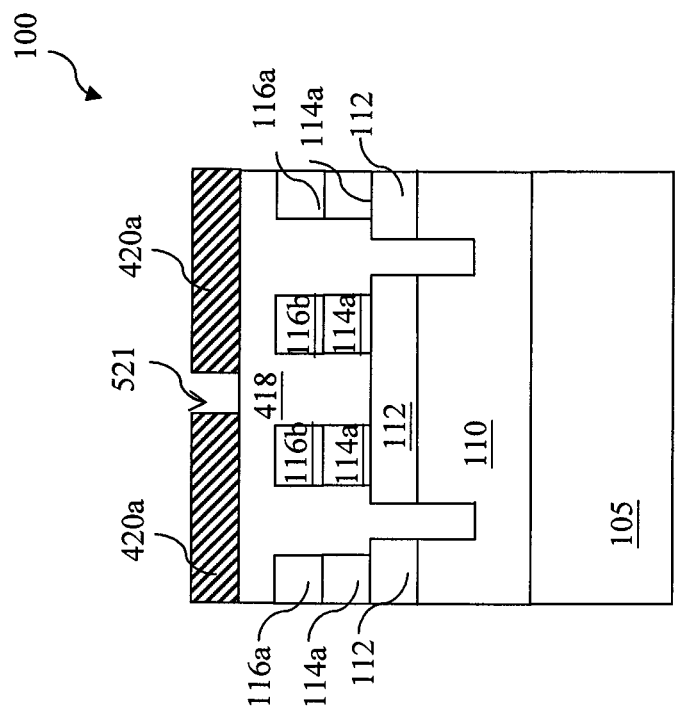
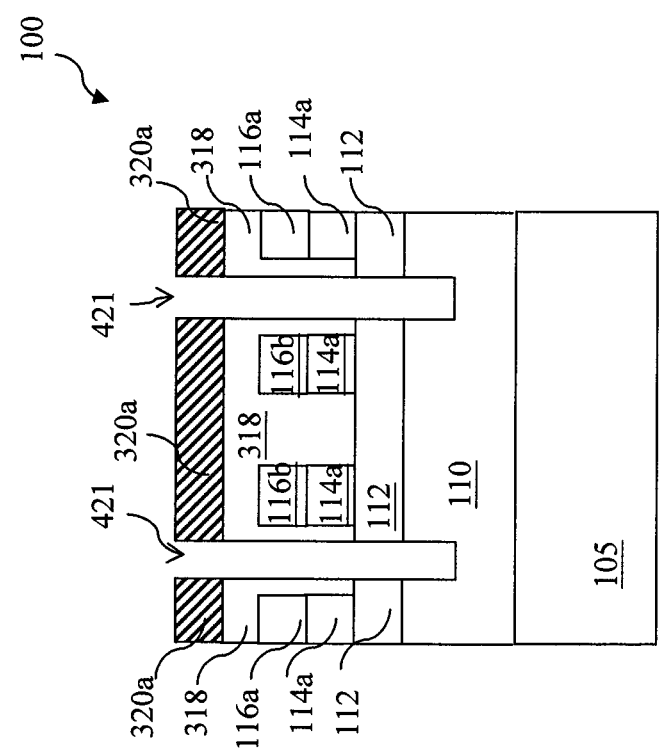
Fig. 7
Fig. 8

DOUBLE PATTERNING STRATEGY FOR CONTACT HOLE AND TRENCH IN PHOTOLITHOGRAPHY

CROSS-REFERENCE

The present disclosure is related to the following commonly-assigned U.S. Patent applications, the entire disclosures of which are incorporated herein by reference: U.S. Provisional Application No. 61/245,447 for "DOUBLE PATTERNING STRATEGY FOR CONTACT HOLE AND TRENCH IN PHOTOLITHOGRAPHY".

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio. Maintaining a desired critical dimension (CD) can be very difficult for various reasons, especially for a resist layer with a high aspect ratio. The double patterning processes have been introduced to form various features with smaller dimensions. However, conventional double patterning processes involve multiple etching processes with high manufacturing cost and low throughput.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 1 through 10 are sectional views of one embodiment of a semiconductor device during various fabrication stages.

DETAILED DESCRIPTION

Figure 2:
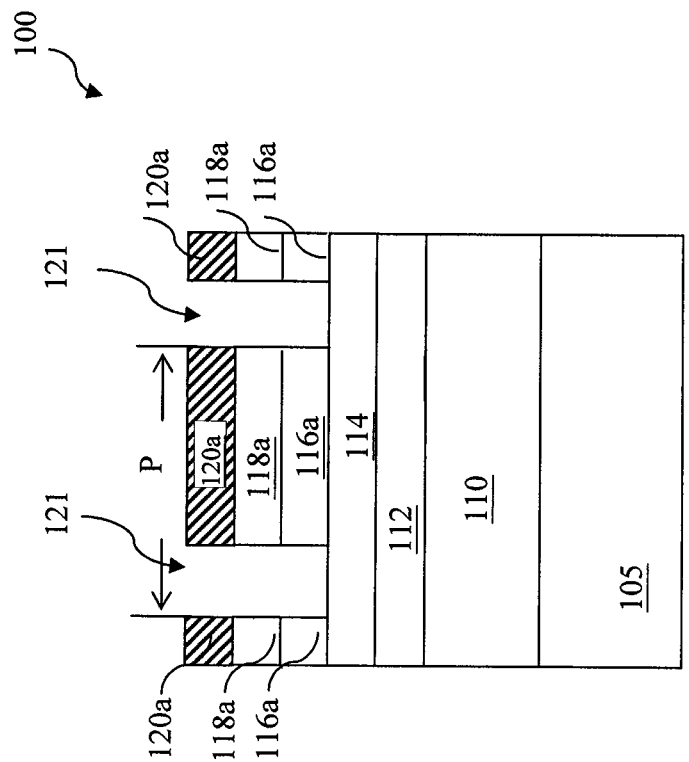

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
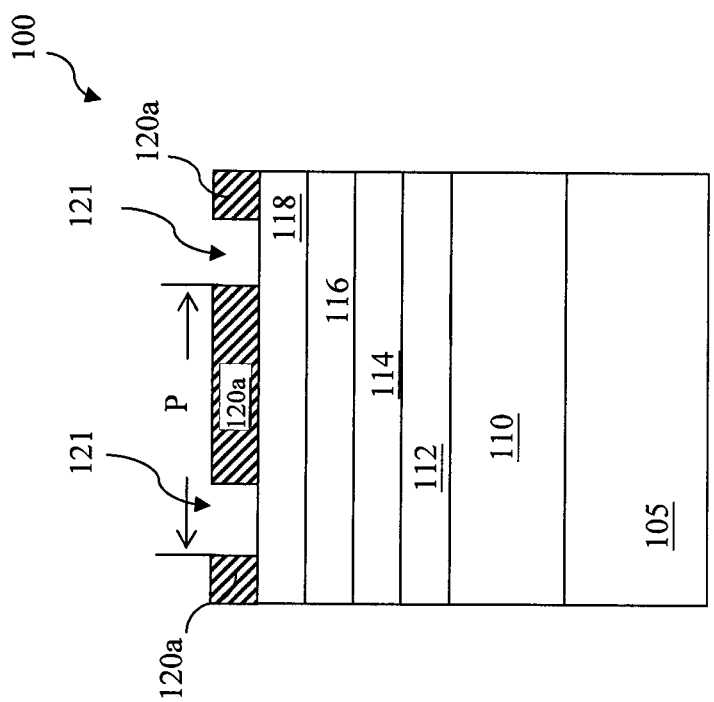
Figure 11:
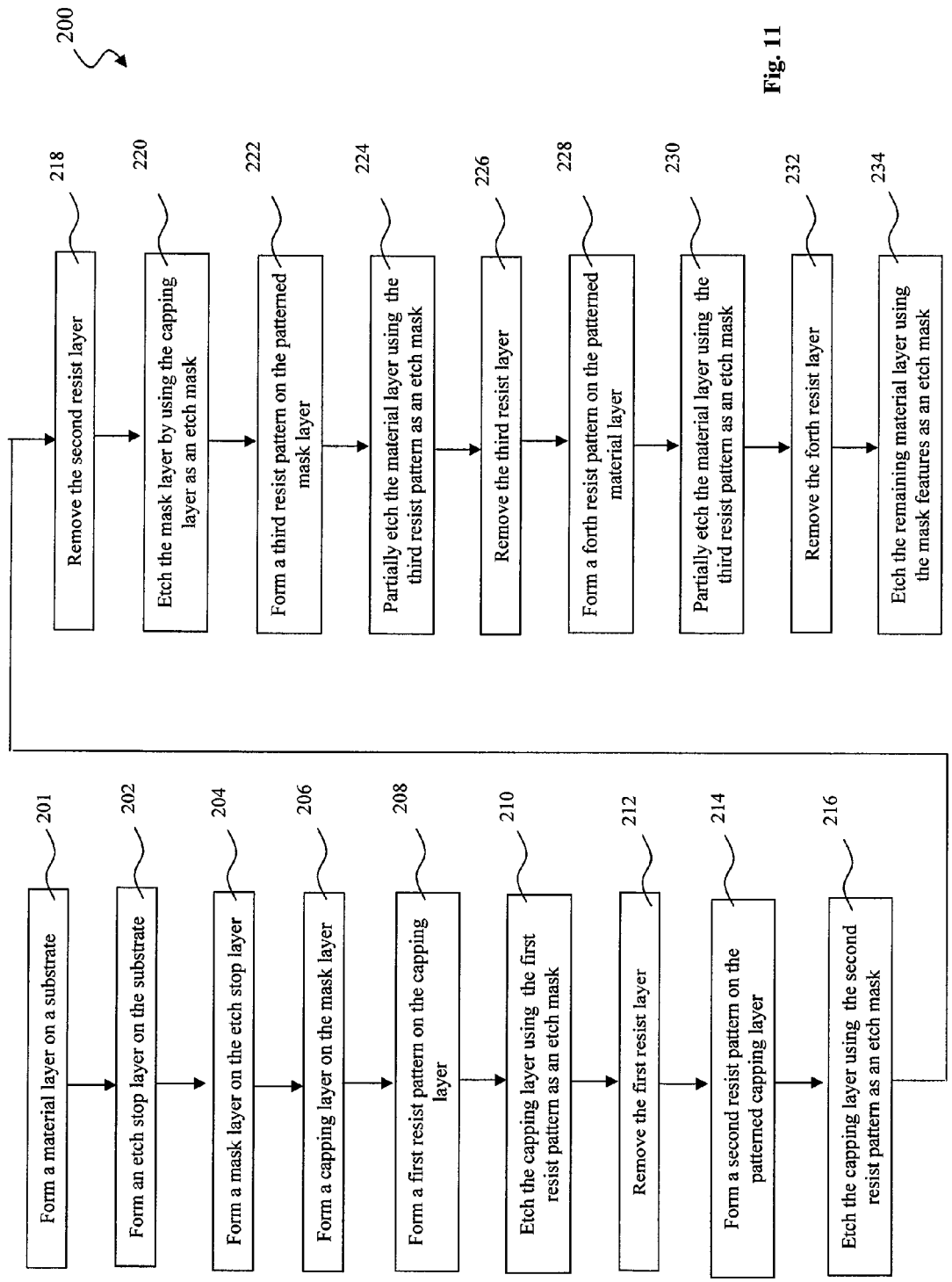
FIG. 11 is a flowchart showing one embodiment of a lithography patterning method.

Referring to FIGS. 1 and 11, an integrated circuit 100 is formed by an exemplary method 200 begun at step 201 by forming one or more underlying material layers (also referred to as "under-material" layers) on a substrate 105. In some embodiments, the substrate 105 may be made of silicon, some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some alternative embodiments, the substrate 105 may include a non-semiconductor material such as a glass for thin-film-transistor liquid crystal display (TFT-LCD) devices, or fused quartz or calcium fluoride for a photomask (mask). The substrate 105 may include various doped regions, dielectric features, and multilevel interconnects. In one embodiment, the substrate 105 includes various doped features for various microelectronic components, such as a complementary metal-oxide-semiconductor field-effect transistor (CMOSFET), imaging sensor, memory cell, and/or capacitive element. In another embodiment, the substrate 105 includes conductive material features and dielectric material features configured for coupling and isolating various microelectronic components, respectively. In another embodiment, the substrate 105 includes one or more material layers formed thereon.

The under-material layer may be a single material or layers of different materials. In the embodiment shown in FIGS. 1-10, a material layer 110 is formed on the substrate 105. In some embodiments, the material layer 110 may be a dielectric material, such as silicon oxide and/or low dielectric-constant (low-k) material. In other embodiments, the material layer 110 may include silicon, poly-silicon, dielectric material, conductive material, or combinations thereof. In some embodiments, the material layer 110 may have a thickness ranging between about 100 angstroms and about 9000 angstroms. For example, the material layer 110 may have a thickness ranging between about 1000 angstroms and 3500 angstroms. In one embodiment, the material layer 110 serves as an interlayer dielectric (ILD) or inter-metal dielectric (IMD). The dielectric materials used for ILD or IMD includes silicon oxide and low-k dielectric materials with a dielectric constant less than about 4. Suitable low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other proper porous polymeric materials. The dielectric material may be formed by a suitable process including spin-on coating or chemical vapor deposition (CVD).

Still referring to FIGS. 1 and 11, the method 200 proceeds to step 202 by forming an etch stop layer 112 on the material layer 110. In some embodiments, the etch stop layer 112 is a nitrogen-free anti-reflection layer which includes silicon oxide (SiO), carbon-doped silicon oxide (carbon-doped SiO), oxynitride (SiON), silicon oxycarbide (SiCO), combinations thereof, or other suitable material film formed by a suitable process, such as CVD or PVD deposition. The etch stop layer 112 may have a thickness ranging between about 50 angstroms and about 500 angstroms, and preferably less than about 300 angstroms. The etch stop layer 112 can function as an etch stop during a later etching process for patterning an overlying mask layer.

Still referring to FIGS. 1 and 11, the method 200 proceeds to step 204 by forming a mask layer 114 on the material layer 112. In some embodiments, the mask layer 114 is a metal mask layer. In some embodiments, the mask layer 114 includes titanium nitride, tantalum nitride, titanium, or other suitable material film formed by a suitable process, such as CVD or PVD deposition. The mask layer 114 may have a thickness ranging between about 50 angstroms and about 500 angstroms. Preferably, in at least one embodiment, the mask layer 114 has a thickness not thicker than about 300 angstroms to prevent gap filling issue caused by openings with high aspect ratio during a later process. The mask layer 114 can function as a mask during a later etching process for patterning the material layer 110 and/or the substrate 105.

Still referring to FIGS. 1 and 11, the method 200 proceeds to step 206 by forming a capping layer 116 on the mask layer 114. The capping layer 116, in one embodiment, is a boron-containing layer. The capping layer 116, in another embodiment, may include amorphous boron, boron nitride, boron carbide, boron oxide, combinations thereof, or other suitable material film formed by a suitable process, such as CVD or PVD deposition. In some embodiments, the capping layer 116 may have a thickness ranging between about 50 angstroms and about 500 angstroms, and preferably not thicker than about 300 angstroms. The capping layer 116 is designed to have higher resistance to an etching reaction during a later etching process for patterning the material layer 110. That is, there is a higher etching selectivity between the capping layer 116 and the material layer 110 during the patterning process of the material layer 110. Hence, as described above, the thinner mask layer 114 could be applied to achieve a better gap filling because of less consumption of the capping layer 116 during the patterning process of the material layer 110.

A first anti-reflective coating (ARC) layer 118 may be optionally formed on the capping layer 116 to reduce reflection during lithography exposing processes, also being referred to as a top anti-reflective coating (TARC) layer or bottom anti-reflective coating (BARC) layer. In one example, the first ARC layer 118 may include organic BARC material formed by a spin-coating technique. The first ARC layer 118 may have a thickness ranging from about 50 angstroms to about 2000 angstroms. In some embodiments, the first ARC layer 118 may be eliminated if the mask layer 114 or the capping layer 116 can function as an anti-reflective layer as well.

Still referring to FIGS. 1 and 11, the method 200 proceeds to step 208 by forming a first resist pattern, including a plurality of first resist features 120a and a plurality of first openings 121 defined by the first resist features 120a, on the first ARC layer 118. The first resist pattern, in one embodiment, is a positive tone resist (positive resist) pattern formed by exposing and developing a first positive resist layer. In another embodiment, the first resist pattern is a negative tone resist (negative resist) pattern formed by exposing and developing a first negative resist layer. Preferably, the first resist pattern is a positive resist pattern. The positive resist is characterized as that the exposed regions will be removed by the developing solution. In one embodiment, the positive resist pattern includes chemical amplifier (CA) resist. The CA resist includes photoacid generator (PAG) that can be decomposed to form acid during a lithography exposure process. More acid can be generated as a result of catalytic reaction. As one example of the formation, the first resist layer is formed on the semiconductor device 100 and then patterned by a first lithography process to form the first resist features 120a and the first openings 121 as illustrated in FIG. 1. The first lithography process uses a lithography system and a first mask. The first resist features 120a are formed according to a predetermined integrated circuit pattern in the first mask. In one embodiment, the first resist features 120a include a pitch P, defined as a distance from one feature to adjacent feature of the first resist pattern. In some embodiments, the pitch P may range between about 50 nm and about 200 nm. As one example, the pitch P is about 100 nm. The first resist pattern may have a thickness ranging between about 500 angstroms and about 5000 angstroms. In various examples, the first resist pattern may have a thickness ranging between about 500 angstroms and about 3000 angstroms, or between about 500 angstroms and about 1500 angstroms. The first lithography process used to form the first resist pattern may include resist coating, exposing, post-exposure baking, and developing. The first lithography process may additionally include soft baking, mask aligning, and/or hard baking. For illustration, the exposing process may be carried out by exposing the semiconductor device 100 under a radiation beam through the first mask.

Referring to FIGS. 2 and 11, the method 200 proceeds to step 210 to etch the first ARC layer 118 and the capping layer 116 using the first resist features 120a as an etch mask. The first ARC layer 118 is partially covered by the first resist features 120a. The uncovered portions of the first ARC layer 118 are removed by a first etching to form a plurality of first ARC features 118a. Portions of the capping layer 116 are exposed after the first etching. The exposed portions of the capping layer 116 are then removed by a second etching to form a plurality of intermediate capping features 116a. The first etching and the second etching could be performed in a single process step or in separated process steps. The process of the second etching is chosen such that the capping layer 116 has a higher etch rate than that of the mask layer 114. Therefore, the uncovered portions of capping layer 116 within the openings 121 are substantially removed during the second etching process. In one embodiment, the first ARC layer 118 and the capping layer 116 can be etched in a single etching process or separated etching processes by using the gas of $C_xH_yF_z$ ($x>0$, $y$, $z>=0$), $O_2$, $N_2$, Ar, $Cl_2$, or mixtures thereof.

Figure 3:
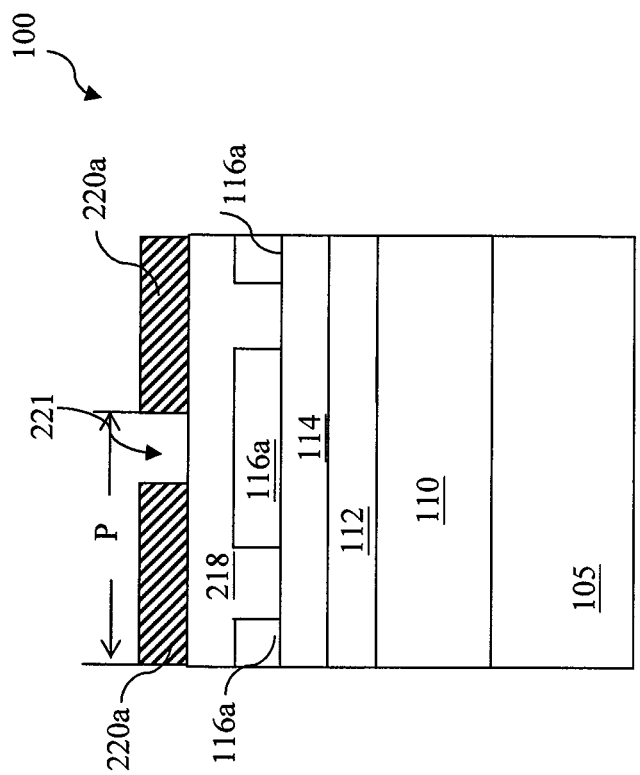

Referring to FIGS. 3 and 11, the method 200 proceeds to step 212 by removing the first resist features 120a and the first ARC features 118a. In some embodiments, the first resist features 120a may be removed by implementing a wet stripping and/or plasma ashing known in the art. For example, an oxygen plasma ashing may be implemented to remove the first resist features 120a. Additionally, the first ARC features 118a may also be simultaneously removed by the same plasma ashing process.

Still referring to FIG. 3, a second anti-reflective coating (ARC) layer 218 may additionally be formed within and above the intermediate capping features 116a to form a substantially smooth surface and reduce reflection during a later lithography exposing process. In one example, the second ARC layer 218 may include organic BARC material formed by a spin-coating technique. The second ARC layer 218 may have a thickness ranging from about 50 angstroms to about 2000 angstroms.

Still referring to FIGS. 3 and 11, the method 200 proceeds to step 214 by forming a second resist pattern, including a plurality of second resist features 220a and a plurality of second openings 221 defined by the second resist features 220a, on the second ARC layer 218. The second resist features 220a and the second openings 221 are formed by exposing and developing a second resist layer on the second ARC layer 218. In one embodiment, the second resist layer is a positive resist layer. In another embodiment, the second resist layer is a negative resist layer. Preferably, the second resist layer has the same tone as the first resist layer. The second resist layer is patterned with a second lithography process. In the second lithography process, the second resist layer is exposed by using a second mask with a second predefined pattern and a lithography system. The second lithography process may further include post-exposure baking, developing, and hard baking.

A plurality of exposed resist features and unexposed resist features are formed (not shown) in the second resist layer by the second exposing process. The exposed resist features are then removed by a subsequent developing process to form the second resist features 220a and the second openings 221. The second resist pattern may be formed to have a pitch similar to the pitch P of the first resist pattern. In one embodiment, the second resist features 220a are configured relative to the first resist features 120a to form a combined pattern in the capping layer 116 so to utilize a double patterning structure. For example, at least one of the second openings 221 is positioned above one of the intermediate capping features 116a. For example, each of the second openings 221 is positioned above each of the intermediate patterned capping feature 116a. In another embodiment, the second openings 221 may be substantially aligned to central portions of the intermediate capping features 116a, respectively. Such that, the pitch defined by the first resist features 120a and the second resist features 220a is halved (½ P), resulting in a reduced minimum features size.

Figure 4:
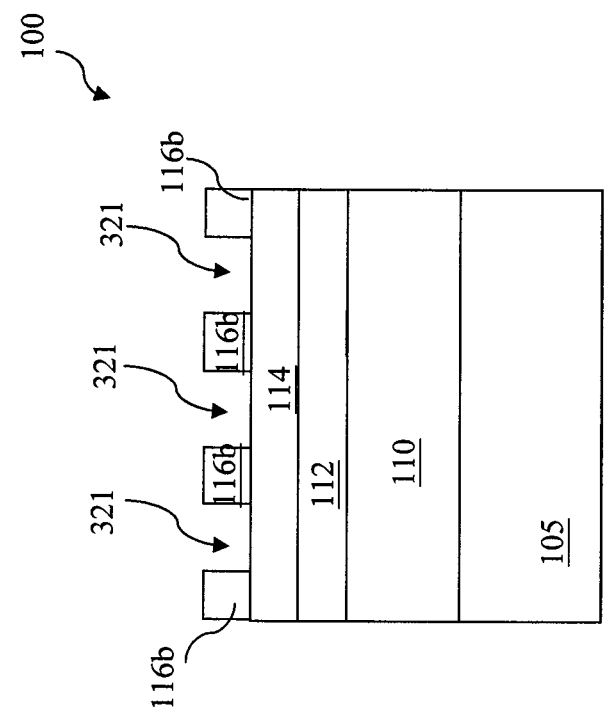

Referring to FIGS. 4 and 11, the method 200 proceeds to step 216 to etch the second ARC layer 218 and the intermediate capping features 116a using the second resist features 220a as an etch mask. The second ARC layer 218 is partially covered by the second resist features 220a. The uncovered portions of the second ARC layer 218 are removed by a third etching to expose portions of the underlying intermediate capping features 116a after the step of third etching. The exposed portions of the intermediate capping features 116a are then removed by a forth etching to form a plurality of final capping features 116b. The third etching and the fourth etching could be performed in a single process step or in separated process steps. The process of the fourth etching is chosen such that the capping layer 116 has a higher etch rate than that of the mask layer 114. Therefore, the capping layer 116 within the openings 221 is substantially removed during the fourth etching process. In one embodiment, the second ARC layer 218 and the intermediate capping features 116a can be etched in a single etching process or separated etching processes by using the gas of CxHyFz (x>0, y, z>=0), $O_2$, $N_2$, Ar, $Cl_2$, or mixtures thereof.

Still referring to FIGS. 4 and 11, the method 200 proceeds to step 218 by removing the second resist features 220a and the remaining second ARC layer 218. The second resist features 220a may be removed by implementing a wet stripping and/or plasma ashing known in the art. For example, an oxygen plasma ashing may be implemented to remove the second resist features 220a. Additionally, the remaining second ARC layer 218 may also be simultaneously removed by the same plasma ashing process. A plurality of openings 321 are thus formed within the final capping features 116b. The openings 321 are used to further form various contact holes or trenches in different applications.

Figure 5:
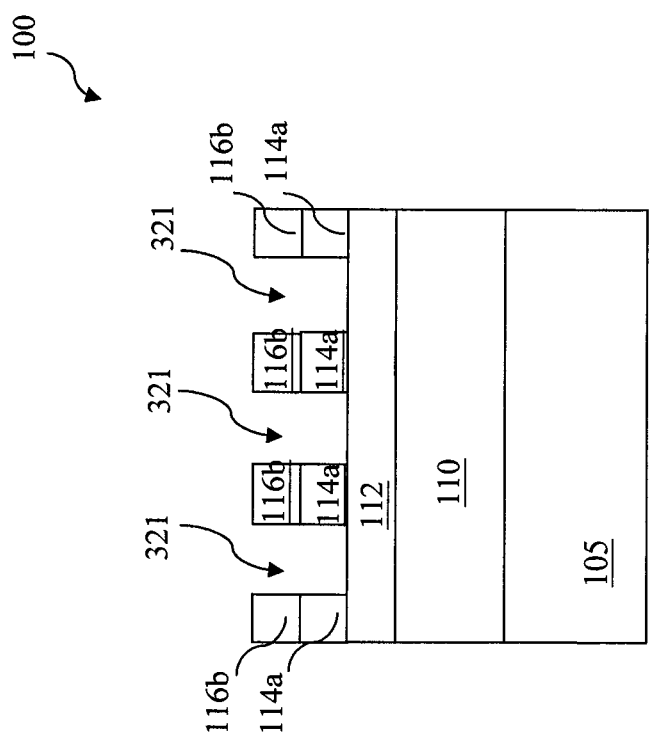

Referring to FIGS. 5 and 11, the method 200 proceeds to step 220 to etch the mask layer 114 by using the final capping features 116b as an etch mask. The process of the etching is chosen such that the mask layer 114 has a higher etch rate than that of the material layer 112. Therefore, the mask layer 114 within the openings 321 is substantially removed during the etching process to form a plurality of mask features 114a. The final capping features 116b may be partially consumed during the etching process. Preferably, in some embodiments, the remaining final capping features 116b are sufficient to protect the underlying mask layer during a later ashing process. The mask layer 114 can be etched by using the chlorine-based gas, such as $Cl_2$, $SiCl_4$, bromine-based gas, such as HBr, and $O_2$, $N_2$, Ar, or mixtures thereof.

Figure 6:
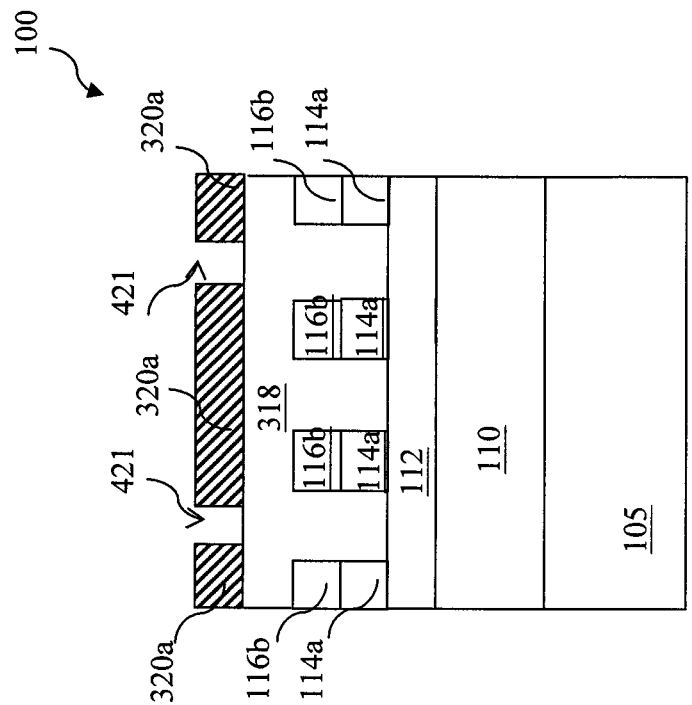

Referring to FIG. 6, a third ARC layer 318 is additionally formed within and above the mask features 114a and the final capping features 116b to form a substantial smooth surface and reduce reflection during a later lithography exposing process. In some embodiments, the third ARC layer 318 may have a thickness ranging from about 50 angstroms to about 2000 angstroms. Still referring to FIGS. 6 and 11, the method 200 proceeds to step 222 by forming a third resist pattern, including a plurality of third resist features 320a and a plurality of third openings 421 defined by the third resist features 320a, on the third ARC layer 318. The third resist features 320a and the third openings 421 are formed by exposing and developing a third resist layer on the third ARC layer 318. In one embodiment, the third resist layer is a positive resist layer. In another embodiment, the third resist layer is a negative resist layer. Preferably, in some embodiments, the third resist layer has the same tone as the first resist layer. The third resist layer is patterned with a third lithography process by using a third mask with a third predefined pattern and a lithography system. The third openings 421 may be defined to have a dimension less than the first openings 121 or the second openings 221. The third openings 421 may be positioned either above the first openings 121 or above the second openings 221. The third lithography process may further include post-exposure baking, developing, and hard baking.

Referring to FIG. 7, the third ARC layer 318 is removed to expose portions of the underlying etch stop layer 112 using the third resist features 320a as an etch mask. The uncovered portions of the etch stop layer 112 are then etched by an etching process that the etch stop layer 112 has a higher etch rate than that of the underlying material layer 110. For example, the etch stop layer 112 is etched by using fluorine-based gas, such as $C_4F_8$, $CF_4$, $CH_2F_2$ and $O_2$, $N_2$, Ar, or mixtures thereof. Still referring to FIGS. 7 and 11, the method 200 may proceed to step 224 by partially removing the exposed portions of the material layer 110. In some embodiments, the depth of the removed material layer 110 is designed to be substantial the same as a trench line thickness in a final dual damascene structure. In some embodiments, the remaining exposed portions of the material layer 110 will be removed during a later etching process. The ratio of the removed portion to the remaining portion can be ranged from about 1 to about 4. Preferably, in some embodiments, the ratio of the removed portion to the remaining portion is 2. The material layer 110 can be etched by using the gas of CxHyFz (x, z>0, y>=0), $CF_3I$, $CH_4$, $NF_3$, $O_2$, $N_2$, $H_2$, Ar, or mixtures thereof.

Referring to FIGS. 8 and 11, the method 200 proceeds to step 226 to remove the third resist features 320a and the remaining third ARC layer 318a by implementing a wet stripping and/or plasma ashing known in the art. Still referring to FIGS. 8 and 11, the method 200 proceeds to step 228 by forming a fourth resist pattern, including a plurality of fourth resist features 420a and a plurality of fourth openings 521 defined by the fourth resist features 420a, on a fourth ARC layer 418. The fourth resist features 420a and the fourth openings 521 are formed by exposing and developing a fourth resist layer. In one embodiment, the fourth resist layer is a positive resist layer. In another embodiment, the fourth resist layer is a negative resist layer. Preferably, in some embodiments, the fourth resist layer has the same tone as the first resist layer. The fourth resist layer is patterned with a fourth lithography process by using a fourth mask with a fourth predefined pattern and a lithography system. The fourth openings 521 may be defined to have a dimension same as to the third openings 421. The fourth openings 521 may be positioned either above the second openings 221 or above the first openings 121, and between the third openings 421. The fourth lithography process may further include post-exposure baking, developing, and hard baking.

Figure 9:
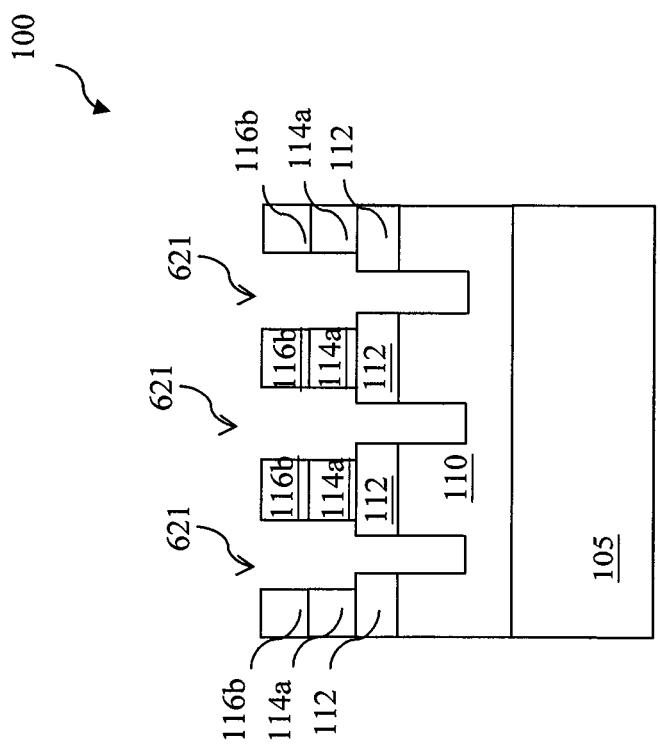

Referring to FIG. 9, portions of the etch stop layer 112 are etched after removing portions of the fourth ARC layer 418 underlying the fourth openings 521. The etching process is chosen that the etch stop layer 112 has a higher etch rate than that of the underlying material layer 110. For example, the etch stop layer 112 is etched by using fluorine-based gas, such as $C_4F_8$, $CF_4$, $CH_2F_2$, and $O_2$, $N_2$, Ar, or mixtures thereof. Still referring to FIGS. 9 and 11, the method 200 may proceed to step 230 by partially removing the exposed portions of the material layer 110. In one embodiment, the depth of the removed material layer 110 is designed to be substantial the same as a trench line thickness in a final dual damascene structure. In another embodiment, the depth of the removed material layer 112 formed by the step 230 is designed to be substantially the same as the depth formed by the step 224. In some embodiments, the remaining exposed portions of the material layer 110 will be removed during a later etching process. The ratio of the removed portion to the remaining portion can be ranged from about 1 to about 4. Preferably, in some embodiments, the ratio of the removed portion to the remaining portion is 2. The material layer 110 can be etched by using the gas of $CxHyFz$ (x, z>0, y>=0), $CF_3I$, $CH_4$, $NF_3$, $O_2$, $N_2$, $H_2$, Ar, or mixtures thereof.

Still referring to FIG. 11, the method 200 may proceed to step 232 by removing the fourth resist features 420a and the remaining third ARC layer 418 by implementing a wet stripping and/or plasma ashing known in the art.

Figure 10:
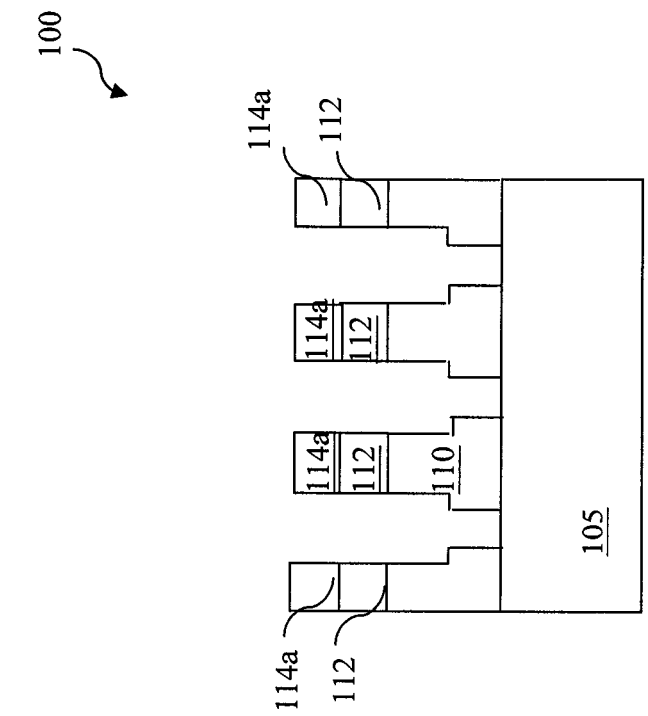

Referring to FIGS. 10 and 11, the method 200 proceeds to step 234 by etching the etch stop layer 112 exposed by the mask layer 114 and/or the capping layer 116. The remaining material layer 110 under openings 621 (shown in FIG. 9) is etched away as well to form dual damascene structures shown in FIG. 10. The final capping features 116b may be partially or all removed during the etching process. Process of the etching is chosen such that the material layer 110 has a higher etch rate than that of the substrate 105. Therefore, dual damascene structures are formed within the material layer 110. Each damascene structure has one trench line above one contact via hole.

In some embodiments, copper, copper alloy, or any other suitable conductors may be filled in the dual damascene structures to form interconnect metallization in integrated circuit 100. As noted above, in some embodiments, thinner mask layer 114 could be applied by adapting a boron-containing capping layer. Therefore, a better gap filling can be achieved for forming the conductor in the damascene structures with relatively low aspect ratio.

The method described above with reference to FIGS. 1 to 11 provides a double patterning process constructed according to various aspects of the present disclosure. The manufacturing throughput and product quality are enhanced, compared with the conventional double patterning and double etching method. In another example, the method 200 is capable of etching a thicker film since the mask layer 114 can be properly chosen with a higher etch resistance.

Various embodiments of a lithography patterning method 200 have been introduced and described. Other modifications, variations, additions, and extensions may be used without departing from the scope of the disclosure. In one example, a plurality of contact holes defined by the first positive and second positive resist patterns are formed in the material layer 110. In some embodiments, a plurality of trenches defined by the first positive and second positive resist patterns are formed in the material layer 110. In another example, the BARC layer and/or mask layer may be eliminated. In yet another example, the positive and negative resist patterns are directly formed on the substrate 105.

In some embodiments, the radiation beam used to expose the first and the second resist layers may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. In some embodiments, the optical exposing process may alternatively be implemented or replaced by other proper methods such as maskless lithography, electron-beam writing, ion-beam writing, and molecular imprint techniques. In another example, the first and second masks used in the method 200 may utilize other mask technologies. For example, the first pattern (or second mask pattern) may be formed in a phase shift mask (PSM). The phase shift mask can print better images than a binary mask.

In one embodiment, the positive resist pattern includes chemical amplifier (CA) resist. In another embodiment, the negative resist layer includes negative resist inert to acid. In furtherance of the embodiment, the negative resist layer includes cyclized synthetic rubber resin, bis-acrylazide, and aromatic solvent. In another embodiment, the positive resist may alternatively include novolac resin, diazonaphthoquinone (DNQ) as photoacitve compound (PAC), and PGME (or PGMEA or ethyl lactate) as solvent. In another example, the negative resist includes silicon-containing material such that the negative resist has an etching resistance greater than that of the positive resist.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an etch stop layer overlying a substrate;
   forming a metal mask layer overlying the etch stop layer;
   forming a boron-containing layer overlying the metal mask layer, wherein the boron-containing layer comprises a material selected from the group consisting essentially of amorphous boron, boron nitride, boron carbide, and combinations thereof;
   forming a first pattern overlying the boron-containing layer;
   etching the boron-containing layer using the first pattern as an etch mask to form a first patterned boron-containing layer having a set of first openings therein;
   removing the first pattern;
   forming a second pattern overlying the first patterned boron-containing layer;
   etching the first patterned boron-containing layer using the second pattern as an etch mask to form a second patterned boron-containing layer having a second opening therein, wherein the second opening positioned between two of the set of first openings; and
   removing the second pattern.

2. The method of claim 1, further comprising a first bottom anti-reflective coating layer underlying the first pattern.

3. The method of claim 1, further comprising a second bottom anti-reflective coating layer underlying the second pattern.

4. The method of claim 1, wherein the etch stop layer is a nitrogen-free anti-reflection layer.

5. The method of claim 1, wherein the metal mask layer includes titanium nitride, tantalum nitride, titanium, or combinations thereof.

6. The method of claim 1, wherein the etch stop layer has a thickness ranging between about 50 angstroms and about 500 angstroms.

7. The method of claim 1, wherein the metal mask layer has a thickness ranging between about 50 angstroms and about 500 angstroms.

8. The method of claim 1, wherein the boron-containing layer has a thickness ranging between about 50 angstroms and about 500 angstroms.

9. The method of claim 1, wherein the metal mask layer has a thickness of about or less than about 300 angstroms.

10. The method of claim 1, wherein the step of etching the boron-containing layer is performed by an etching gas comprising of $C_xH_yF_z$ ($x>0$, $y$, $z>=0$), $O_2$, $N_2$, Ar, $Cl_2$, or mixtures thereof.

11. The method of claim 1, wherein the first and the second patterns are removed in an ashing process with at least one oxygen-containing gas.

12. The method of claim 1, further comprising a step of etching the metal mask layer using the second patterned boron-containing layer as an etch mask.

13. A method of forming a semiconductor structure, comprising:
    forming a dielectric layer overlying a substrate;
    forming an etch stop layer overlying the substrate;
    forming a metal mask layer overlying the etch stop layer;
    forming a boron-containing layer overlying the mask layer, wherein the boron-containing layer comprises a material selected from the group consisting essentially of amorphous boron, boron nitride, boron carbide, and combinations thereof;
    forming a first resist pattern overlying the boron-containing layer;
    etching the boron-containing layer using the first resist pattern as an etch mask to form a plurality of intermediate boron-containing features;
    removing the first resist pattern by a first ashing process;
    forming a second resist pattern overlying the intermediate boron-containing features;
    etching the intermediate boron-containing features using the second resist pattern as an etch mask to form a plurality of final boron-containing features;
    removing the second resist pattern by a second ashing process; and
    etching the metal mask layer using the final boron-containing features as an etch mask to form a patterned metal mask layer.

14. The method of claim 13, further comprising a step of etching the dielectric layer using the patterned metal mask layer as an etch mask.

15. The method of claim 13, wherein the metal mask layer includes titanium nitride, tantalum nitride, titanium, or combinations thereof.

16. The method of claim 13, wherein the metal mask layer has a thickness of about or less than about 300 angstroms.

17. The method of claim 13, wherein the step of etching the boron-containing layer is performed by an etching gas comprising of $C_xH_yF_z$ ($x>0$, $y$, $z>=0$), $O_2$, $N_2$, Ar, $Cl_2$, or mixtures thereof.

18. A method of forming a semiconductor structure, comprising:
    forming a dielectric layer overlying a substrate;
    forming an etch stop mask layer overlying the dielectric layer;
    forming a metal mask layer overlying the etch stop mask layer, wherein the metal mask layer has a thickness not thicker than 300 angstroms;
    forming a boron-containing layer overlying the metal mask layer;
    forming a first resist pattern overlying the boron-containing layer, the first resist pattern is formed by a first positive resist layer having a plurality of first openings therein;
    etching the boron-containing layer using the first resist pattern as an etch mask to form a first patterned boron-containing layer having the plurality of first openings therein;
    removing the first resist pattern;
    forming a second resist pattern overlying the first patterned boron-containing layer, the second resist pattern is formed by a second positive resist layer having a plurality of second openings therein;
    etching the first patterned boron-containing layer using the second resist pattern as an etch mask to form a second patterned boron-containing layer having the plurality of second openings therein, wherein at least one of the plurality of second openings positioned between two of the plurality of first openings;
    removing the second resist pattern;
    etching the metal mask layer using the second patterned boron-containing layer as an etch mask to form a patterned metal mask layer; and
    etching the dielectric layer using the patterned metal mask layer as an etch mask to form a patterned dielectric layer, wherein after the step of etching the dielectric layer is finished, a portion of the second patterned boron-containing layer remains.

19. The method of claim 12, further comprising, after etching the metal mask layer, etching a material layer underlying the metal mask layer using the metal mask layer as an etch mask, wherein after the step of etching the material layer is finished, a portion of the second patterned boron-containing layer remains.

20. The method of claim 14, where after the step of etching the dielectric layer is finished, a portion of the final boron-containing features remains.

* * * * *